United States Patent
Matsuda

(10) Patent No.: US 7,550,700 B2
(45) Date of Patent: Jun. 23, 2009

(54) LIGHT-RECEIVING SEMICONDUCTOR DEVICE AND OPTICAL PICKUP DEVICE

(75) Inventor: Masaki Matsuda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/783,385

(22) Filed: Apr. 9, 2007

(65) Prior Publication Data

US 2007/0235633 A1    Oct. 11, 2007

(30) Foreign Application Priority Data

Apr. 11, 2006   (JP)   ............... 2006-108270

(51) Int. Cl.
  G02B 7/04   (2006.01)
  H03F 3/08   (2006.01)
  G11B 7/00   (2006.01)
  G01J 3/52   (2006.01)

(52) U.S. Cl. .................. 250/201.5; 250/214 A; 369/44.11; 356/423

(58) Field of Classification Search ............. 250/214 R, 250/214 A, 201.5, 559.29, 208.4, 214 LA, 250/214 LS, 214 AL; 359/225–226, 333–334, 359/338; 369/44.11, 44.12, 44.23, 44.32; 356/423–425

See application file for complete search history.

(56) References Cited

U.S. PATENT DOCUMENTS 4,162,399 A * 7/1979 Hudson ................. 250/231.14

6,710,915 B2 * 3/2004 Itoh ........................... 359/333

FOREIGN PATENT DOCUMENTS

| JP | 2000-258244 | 9/2000 |
| JP | 2001-209959 | 8/2001 |
| JP | 2005-63543 | 3/2005 |
| KR | 10-2004-0095079 | 11/2004 |
| KR | 10-2005-0067650 | 7/2005 |

OTHER PUBLICATIONS

Korean Office Action dated Nov. 6, 2008 with Partial English-Language Translation of the Japanese-Language Translation.
Korean Office Action dated May 20, 2008 with a partial English translation.

* cited by examiner

*Primary Examiner*—Georgia Y Epps
*Assistant Examiner*—Don Williams
(74) *Attorney, Agent, or Firm*—McGinn IP Law Group, PLLC

(57) ABSTRACT

According to an embodiment of the present invention, a semiconductor device used in an optical disk device driving an optical disk, includes: an optical pickup device detecting an optical signal irradiated to the optical disk and converting the detected optical signal into an electric signal to output the electric signal; and a light amount detecting circuit amplifying the electric signal output from the optical pickup device, the optical pickup device including a plurality of light receiving elements different in receiving sensitivity and the light amount detecting circuit including at least one amplifier or two or more amplifiers of the same amplifying characteristics.

20 Claims, 6 Drawing Sheets

LIGHT-RECEIVING SEMICONDUCTOR DEVICE AND OPTICAL PICKUP DEVICE

BACKGROUND OF THE INVENTION

1. Field of the Invention

The present invention relates to a light-receiving semiconductor device, an optical pickup device, and an optical disk device. In particular, the invention relates to a light-receiving semiconductor device having different receiving sensitivities.

2. Description of Related Art

Up to now, a CD-ROM (Compact Disk Read Only Memory) or the like has been used as a recording medium typified by an optical disk. In recent years, various kinds of recording media have been developed along with an increase in recording capacity of electronic data. For example, a DVD-ROM (Digital Versatile Disk Read Only Memory) having a large recording capacity has been used in place of existing CD-ROMs. An optical pickup for reading data recorded on such an optical disk has been developed.

In the optical pickup used in CD/DVD (Compact Disk/Digital Versatile Disk) and the like, laser light is irradiated to the disk to write/read information. As for the write/read processing, laser light power is large during writing data and is small during reading data. Accordingly, a light receiving element that receives laser light for writing/reading data should detect both of strong light and weak light with high accuracy. Meanwhile, high-speed response is required of the light receiving element along with an increase in recording speed.

Japanese Unexamined Patent Application Publication No. 2001-209959 discloses an example of the optical pickup circuit. In the optical pickup circuit, a photocurrent from one light receiving element is supplied to an amplifier capable of switching an amplification factor. The amplifier switches its amplification factor to a small amplification factor at the time of detecting strong light and to a large amplification factor at the time of detecting weak light.

The above optical pickup circuit switches a gain to a low gain when receiving strong light and to a high gain when receiving weak light to thereby detect a signal without decreasing an S/N ratio.

As shown in FIG. 8, in the case of switching an amplification factor of the amplifier, an amplification factor of an operational amplifier for amplifying a signal is inversely proportional to a frequency band, resulting in a problem in that high-frequency response characteristic reduces as the large amplification factor is increased for detecting a signal of weak light.

In addition, Japanese Unexamined Patent Application Publication No. 2000-258244 discloses an in-vehicle optical sensor that detects weak current. In the optical sensor, a light-receiving surface of a light receiving element is split, and a car air conditioner is controlled in accordance with a received light amount of each light receiving region.

The conventional optical pickup circuit detects strong light and weak light during reading/writing data in this way and thus has a problem in that both of high detection accuracy relative to an incident light intensity and high-speed response characteristic are difficult to realize.

SUMMARY OF THE INVENTION

According to an aspect of the present invention, a light-receiving semiconductor device used in an optical disk device driving an optical disk includes a light-receiving unit including a plurality of light receiving elements different in receiving sensitivity and detecting an optical signal irradiated to the optical disk and converting the detected optical signal into an electric signal to output the electric signal; and an amplifying unit including at least one amplifier or two or more amplifiers of the same amplifying characteristics and amplifying the electric signal output from the light-receiving unit.

According to another aspect of the invention, an optical pickup device includes a light-emitting unit irradiating light to the optical disk; and a light-receiving semiconductor device described above.

According to a preferred embodiment of the present invention, it is possible to provide a light-receiving semiconductor device, an optical pickup device, and an optical disk device which can attain high detection accuracy relative to incident light intensity and high-speed response characteristic.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device according to the present invention is a light-receiving semiconductor device preferably used in a CD/DVD player, a ROM, a recording medium, or the like and used for an optical disk device.

Hereinafter, embodiments of the present invention are described with reference to the accompanying drawings.

First Embodiment

Figure 1:
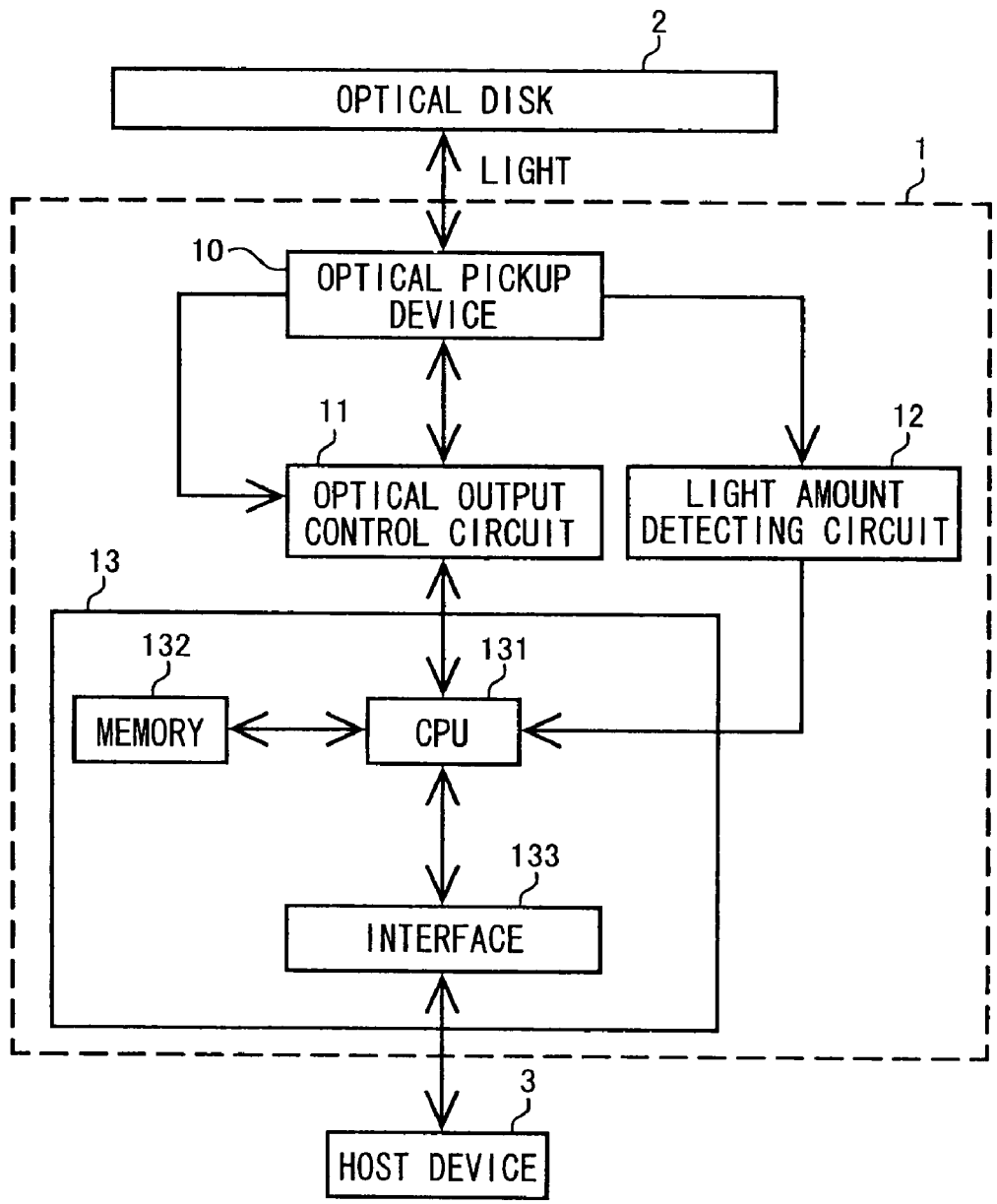
FIG. 1 is a schematic diagram of a configuration example of an optical disk device according to the present invention.

Referring first to FIG. 1, the overall configuration of an optical disk device according to a preferred embodiment of the present invention is described. FIG. 1 shows a main part of the optical disk device of the preferred embodiment.

As shown in FIG. 1, an optical disk device 1 of the preferred embodiment includes an optical pickup device 10, an optical output control circuit 11, a light amount detecting circuit 12, and a control circuit 13.

The optical pickup device 10 includes a light emitting element, an optical element, and a light receiving element. The light emitting element is composed of a laser diode, a light-emitting diode, or the like and functions as a light-emitting unit for emitting laser light. The optical element is composed of a convex-lens half mirror (not shown) and the like and has a function of guiding laser light emitted from the light emitting element to a recording surface of the optical disk 2. The light receiving element functions as a light-receiving unit that receives reflected light from the optical disk 2.

The optical output control circuit 11 controls an amount of light emitted from the light emitting element. The optical output control circuit 11 executes control such that an amount of light emitted from the light emitting element becomes constant in accordance with an amount of reflected light that is incident on the light receiving element, during reading data from the optical disk 2. Further, the optical output control circuit 11 controls an emitted light amount in the light emitting element during writing data to the optical disk 2.

The light amount detecting circuit 12 is composed of an A/D converter circuit and the like, and detects an amount of light emitted from the light receiving element. Receiving reflected light from the optical disk 2, the light amount detecting circuit 12 converts an analog signal output from the light receiving element into a digital signal and outputs the resultant signal to the control unit 13 in the form of digital data corresponding to a reflected light amount.

The control unit 13 is composed of a CPU 131, a memory 132, an interface 133, and the like, and controls operations of the optical disk device 1. The CPU 131 executes computations or process for controlling each block of a read/write device for the optical disk. The memory 132 stores data necessary for operations of the CPU 131. The interface 133 receives/transmits data from/to a host device 3 that uses an optical disk device as an external storage device.

Referring next to FIGS. 2 to 4B, the detailed configuration of the optical disk device 1 according to a first embodiment the present invention is described.

In the optical pickup device 10 of the first embodiment, one light receiving element is provided and a light-receiving surface thereof is split into plural light receiving regions at different area ratios. These plural light receiving regions output photocurrent in accordance with the area ratios. In this case, the area ratios are set to ensure a uniform output amount of the photocurrent. Hence, photocurrents of a uniform amount are output to a same amplifier provided in the light amount detecting circuit 12, and the amplifier amplifies the currents with the same gain.

Figure 2:
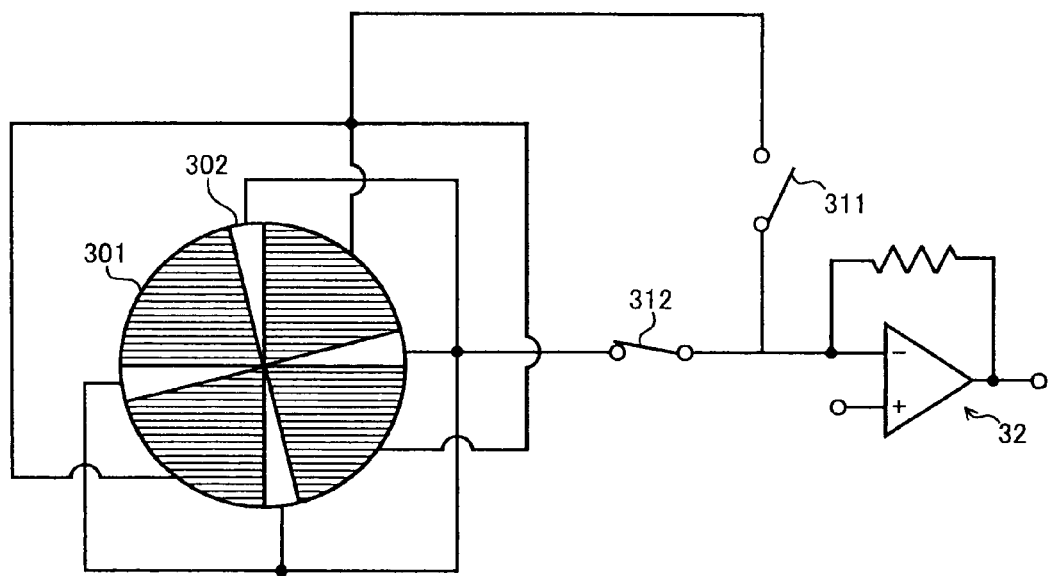
FIG. 2 is a schematic diagram of a specific example of the configuration of an optical pickup device and a light amount detecting circuit according to the first embodiment of the present invention.

A schematic diagram of FIG. 2 shows a specific example of the configuration of the optical pickup device 10 and the light amount detecting circuit 12. FIG. 2 illustrates a main part of the optical pickup device 10 and the light amount detecting circuit 12.

As shown in FIG. 2, the light receiving element of the optical pickup device 10 has large-area light receiving regions 301 and small-area light receiving regions 302. The plural light receiving regions 301 and plural light receiving regions 302 are radially-arranged. More specifically, the split light receiving regions 301 and 302 are alternately arranged along the circumference. For example, an area of the large-area light receiving region 301 may be set 10 times larger than an area of the small-area light receiving region 302.

The light amount detecting circuit 12 has switches 311 and 312, and an amplifier 32. The switches 311 and 312 are connected to a non-inverting terminal of the amplifier 32. The switch 311 is connected to each of the split large-area light receiving regions 301, and an output signal of the large-area light receiving region 301 is input to the amplifier 32. The switch 312 is connected to each of the split small-area light receiving regions 302, and an output signal of the small-area light receiving region 302 is input to the amplifier 32. The switches 311 and 312 are turned ON/OFF in accordance with a control signal from the control unit 13.

Figure 3:
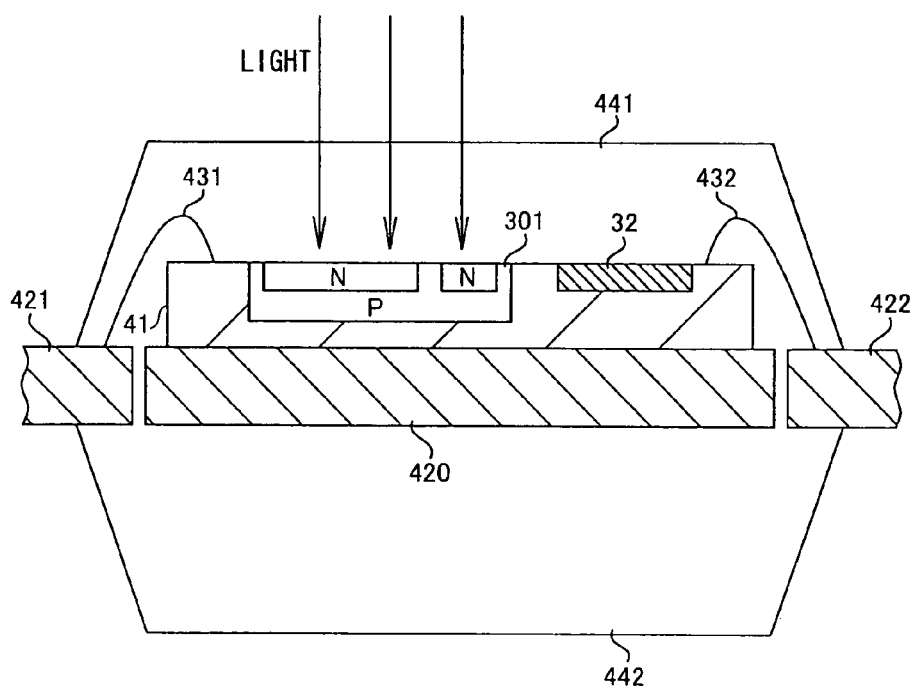
FIG. 3 is a schematic diagram of a configuration example of a light receiving element of the optical pickup device according to the first embodiment of the present invention.

A schematic diagram of FIG. 3 shows a specific example of the configuration of the optical pickup device 10 and the light amount detecting circuit 12. FIG. 3 is a schematic sectional view of the optical pickup device 10 and the light amount detecting circuit 12.

As shown in FIG. 3, the light receiving region 301 of the light receiving element and the amplifier 32 of the light amount detecting circuit 12 are formed on a silicon substrate 41. The light receiving region 301 includes a P-type layer and an N-type layer formed on the P-type layer. The silicon substrate 41 is secured in a predetermined position of a lead frame 420 and connected to the lead frame 420. The silicon substrate 41 is connected to lead frames 421 and 422 with bonding wires 431 and 432. The light receiving region 301 and the amplifier 32 are molded with transparent resins 441 and 442.

Figure 4A:
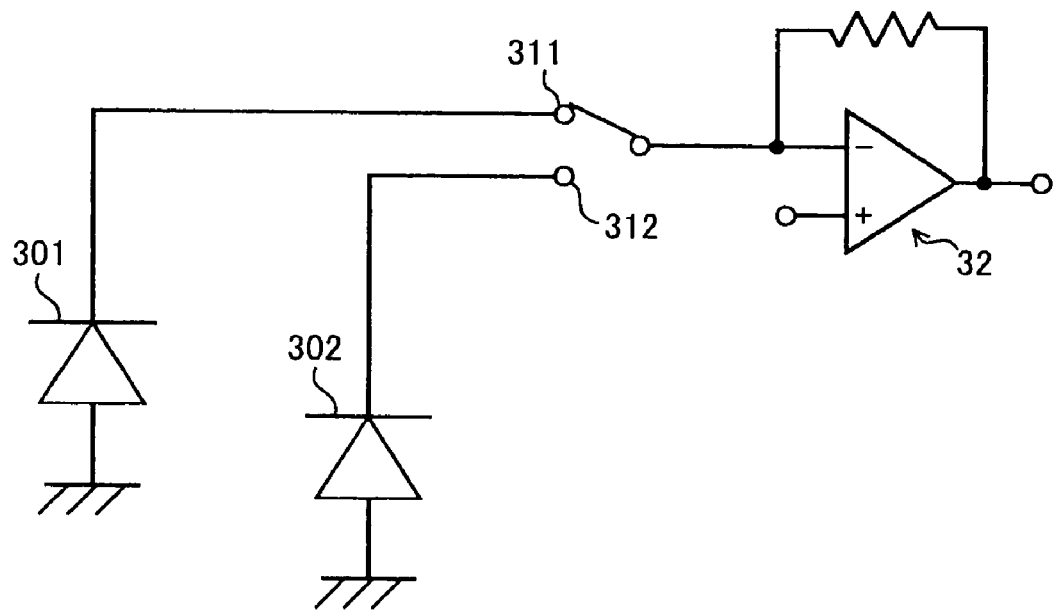
FIGS. 4A and 4B are schematic diagrams of a circuit configuration example of the optical pickup device and the light amount detecting circuit according to the first embodiment of the present invention.
Figure 4B:
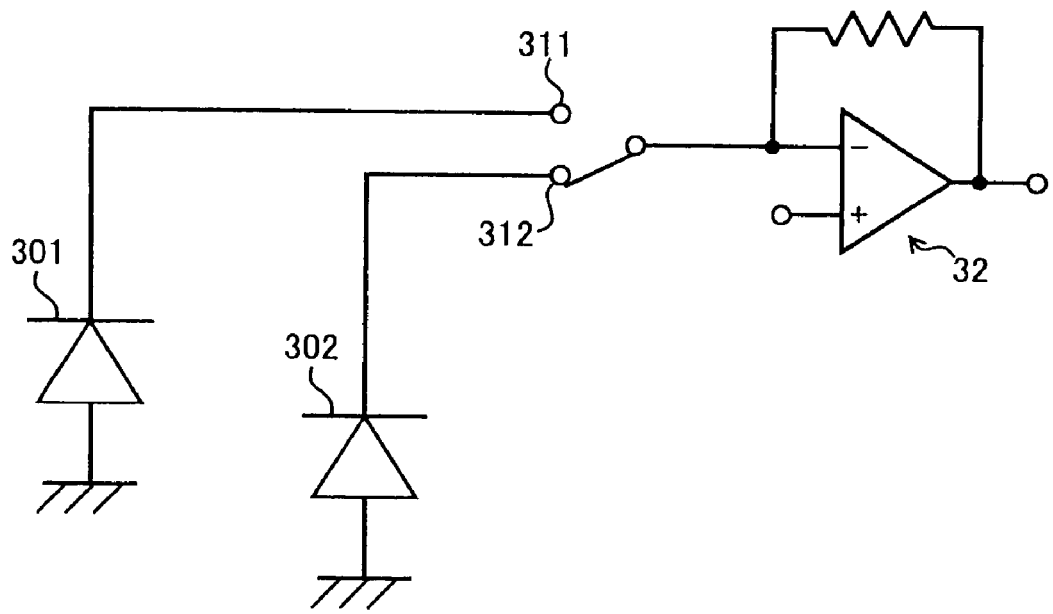

FIGS. 4A and 4B are schematic diagrams of a specific example of the circuit configuration of the optical pickup device 10 and the light amount detecting circuit 12.

FIG. 4A shows the configuration at the time of reading data. During reading data, a power of light emitted from the light emitting element is small, so a power of light incident on the light receiving element is small. In this case, the control unit 13 turns ON the switch 311 and turns OFF the switch 312 under control in accordance with a control signal generated based on reading operations. Thus, the large-area light receiving region 301 is selected and connected to the non-inverting terminal of the amplifier 32. The light receiving region 301 outputs photocurrent in accordance with a received light amount, and the photocurrent is input to the amplifier 32.

FIG. 4B shows the configuration at the time of writing data. A power of light emitted from the light emitting element for writing data is generally larger than a power for reading data, so a power of light incident on the light receiving element is large. In this case, the control unit 13 turns OFF the switch 311 and turns ON the switch 312 under control based on a control signal generated in accordance with writing operations. Hence, the small-area light receiving region 302 is selected and connected to the non-inverting terminal of the amplifier 32. The light receiving region 302 outputs photocurrent in accordance with a received light amount and the photocurrent is input to the amplifier 32.

During either the read operations or the write operations, light is almost uniformly incident on the entire light receiving element, so the received light amount for read or write operations is determined based on an area ratio between the light receiving regions 301 and 302. Accordingly, the light receiving element outputs photocurrent in accordance with the area ratio between the light receiving regions 301 and 302 during reading or writing data. In other words, light that is almost uniformly incident on the entire light receiving element can diverge into photocurrents in accordance with the area ratio between the light receiving regions 301 and 302. The light split based on the area ratio between the light receiving regions 301 and 302 is output to the amplifier 32.

For example, an area of the large-area light receiving region 301 can be set 10 times as large as that of the small-area light receiving region 302. In this case, an output amount of the large-area light receiving region 301 during reading data is 10 times larger than an output amount of the small-area light receiving region 302 during writing data. Therefore, provided that a power of light emitted from the light emitting element for reading data is 1/10 of a power for writing data, the light emitting element outputs the same amount of light in read/write operations, and the output light can be input to the amplifier 32.

As described above, in the optical disk device 1 of this embodiment, even if a received light power differs between reading operations and writing operations, photocurrents of the same amount can be output by splitting the light-receiving surface of the light receiving element into the light receiving regions 301 and 302. As a result, an amount of signal current input to the amplifier 32 that detects a signal can be kept constant.

Therefore, even if a level of light incident on the light receiving element varies, the input signal level of the amplifier 32 is constant, so the amplifier 32 of the same characteristics can be used, and the same output characteristics of the amplifier can be attained. Accordingly, it is unnecessary to set an amplification factor ratio of the amplifier, the device can be designed with more emphasis on high-speed response characteristic without being limited by trade-off between a gain and a frequency band. Thus, it is possible to realize both of high detection accuracy relative to incident light intensity of a wider range and a high-speed response characteristic.

Incidentally, this embodiment describes one light receiving element the light-receiving surface of which is split into plural light receiving regions at different area ratios. Here, the plural light receiving regions are each referred to as "light receiving element" in some cases. In such cases, it is assumed that one light receiving element is split into plural light receiving elements.

Second Embodiment

In the first embodiment, the light-receiving surface of one light receiving element is split into plural light receiving regions. A second embodiment of the present invention describes an example where effects similar to the first embodiment are obtained by changing the number of light receiving elements. That is, in the second embodiment, plural light receiving element groups different in the number of elements are provided, and the plural light receiving element groups output photocurrent in accordance with the number of elements. At this time, the number of elements in each group is determined such that the same amount of photocurrent is output.

Further, in the second embodiment, photocurrents output from each light receiving element group are input to different amplifiers. These amplifiers are set to have the same characteristics, making it possible to amplify output signals of each light receiving element group with the same gain.

Figure 5:
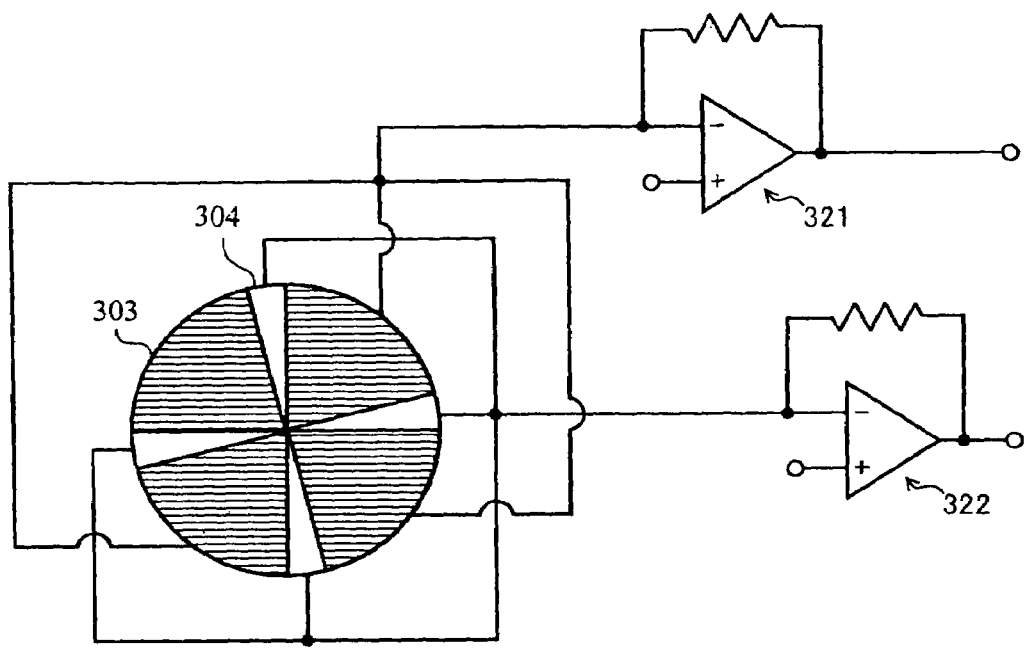
FIG. 5 is a schematic diagram of a schematic example of the configuration of an optical pickup device and a light amount detecting circuit according to a second embodiment of the present invention.
Figure 6:
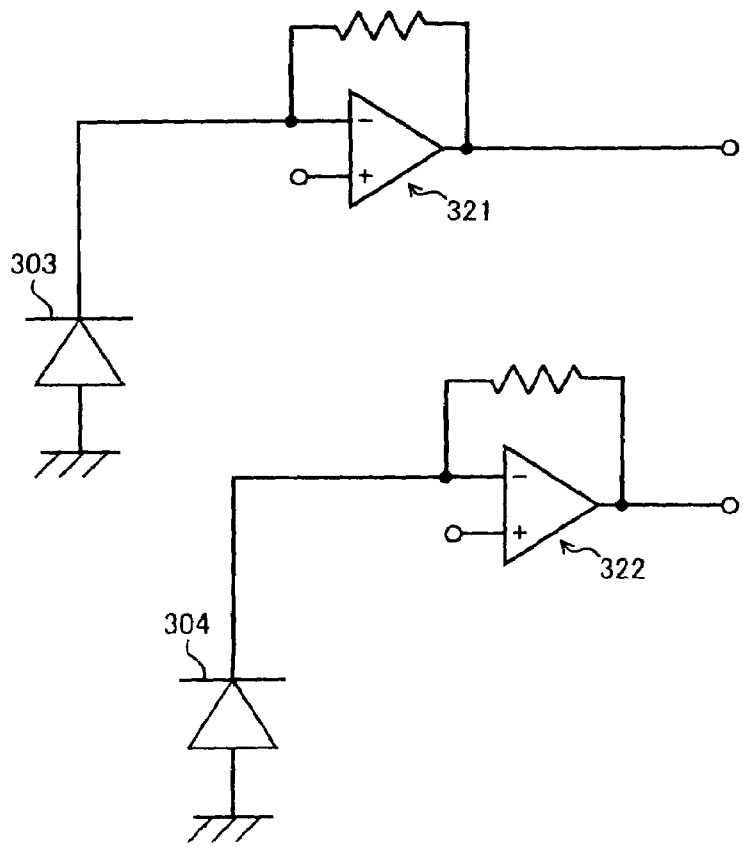
FIG. 6 is a schematic diagram of a circuit configuration example of the optical pickup device and the light amount detecting circuit according to the second embodiment of the present invention.

A schematic description about the second embodiment is given below with reference to FIGS. 5 and 6. FIG. 5 is a schematic diagram of the configuration of the optical pickup device and the light amount detecting circuit. FIG. 6 is a schematic diagram of a circuit configuration example of the optical pickup device and the light amount detecting circuit.

As shown in FIG. 5, the optical pickup device 10 includes plural light receiving elements. More specifically, the plural light receiving elements are divided into light receiving element groups 303 having more elements and light receiving element groups 304 having fewer elements. The light receiving element groups 303 and 304 are radially-arranged each group. More specifically, the light receiving element groups 303 and 304 are alternately arranged along the circumference. For example, the number of light receiving element groups 303 having more elements may be set 10 times larger than the number of light receiving element groups 304 having fewer elements.

The light amount detecting circuit 12 includes the amplifiers 321 and 322 with the same gain, and non-inverting terminals of the amplifiers 321 and 322 are connected to the light receiving element group 303 having more elements and the light receiving element group 304 having fewer elements. Output signals of the light receiving element groups 303 and 304 are input to the amplifiers 321 and 322.

A schematic diagram of FIG. 6 shows a schematic example of the circuit configuration of the optical pickup device 10 and the light amount detecting circuit 12.

As shown in FIG. 6, a power of light emitted from the light emitting element for reading data is small, so a power of light incident on the light receiving element is small. In this case, the control unit 13 drives the light receiving element group 303 having more elements and the amplifier 321 based on a control signal generated according to reading operations. Thus, the light receiving element group 303 having more elements outputs a photocurrent in accordance with a received light amount, and the photocurrent is input to the amplifier 321.

In general, a power of light emitted from the light emitting element for writing data is generally larger than a power of light for reading data, so a power of light incident on the light receiving element is large. In this case, the control unit 13 drives the light receiving element group 304 having fewer elements and the amplifier 322 based on a control signal generated according to writing operations. Hence, the light receiving element group 304 having fewer elements outputs photocurrent in accordance with a received light amount, and the photocurrent is output to the amplifier 322.

Plural light receiving elements output photocurrents in accordance with the numbers of the light receiving element groups 303 and 304 during the reading or writing operations. Output currents of the light receiving element groups 303 and 304 are input to the amplifiers 321 and 322 which are different albeit the same characteristics.

For example, the light receiving element group 303 having more elements may include elements 10 times as many as the light receiving element group 304 having fewer elements. At this time, an output current amount of the light receiving element group 303 having fewer elements for writing data is 10 times larger than that of the light receiving element group 304 having more elements for reading data. Therefore, provided that a power of light emitted from the light emitting element for reading data is 1/10 of that for writing data, the light emitting element can output the same amount of current during reading/writing data, and the current can be input to the amplifiers 321 and 322 of the same characteristics.

As described above, even in the second embodiment, similar to the first embodiment, the numbers of light receiving elements belonging to the light receiving element groups 303 and 304 are set as appropriate to thereby output the same amount of photocurrents. Hence, the amplifier 32 can be used to attain the same amplifier output characteristics. Hence, high detection accuracy relative to an incident light intensity in a wide range and high-speed response characteristic can be both attained.

Further, in the second embodiment, the light receiving element groups 303 and 304 are provided with the amplifiers 321 and 322, respectively, so the plural amplifiers are necessary. In contrast, in the first embodiment, the plural light receiving regions 301 and 302 are switched with the switches 311 and 312 and output currents are input to the single amplifier 32. Thus, the number of amplifiers in the first embodiment can be reduced to ½ of that of the second embodiment, making it possible to downsize the circuit.

Other Embodiments

Figure 7A:
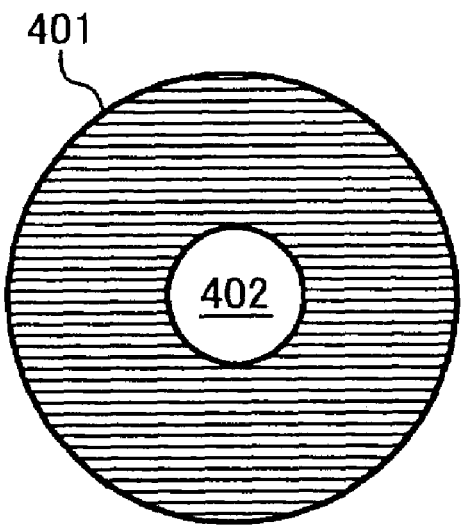
FIGS. 7A and 7B are schematic diagrams of a configuration example of a light receiving element of the optical pickup device according to the second embodiment of the present invention.
Figure 7B:
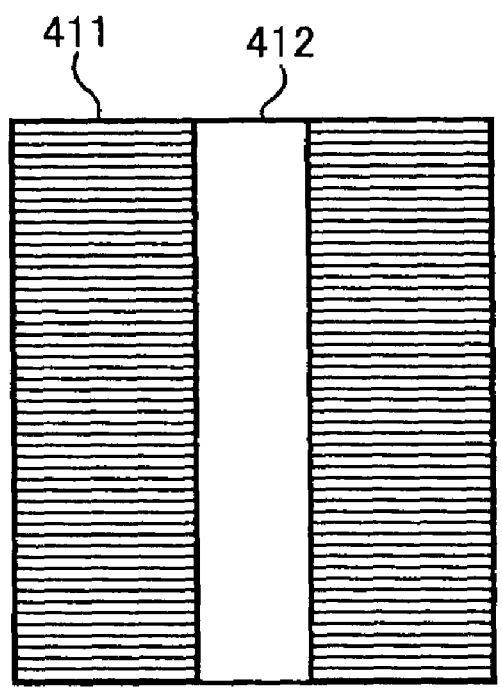
Figure 8:
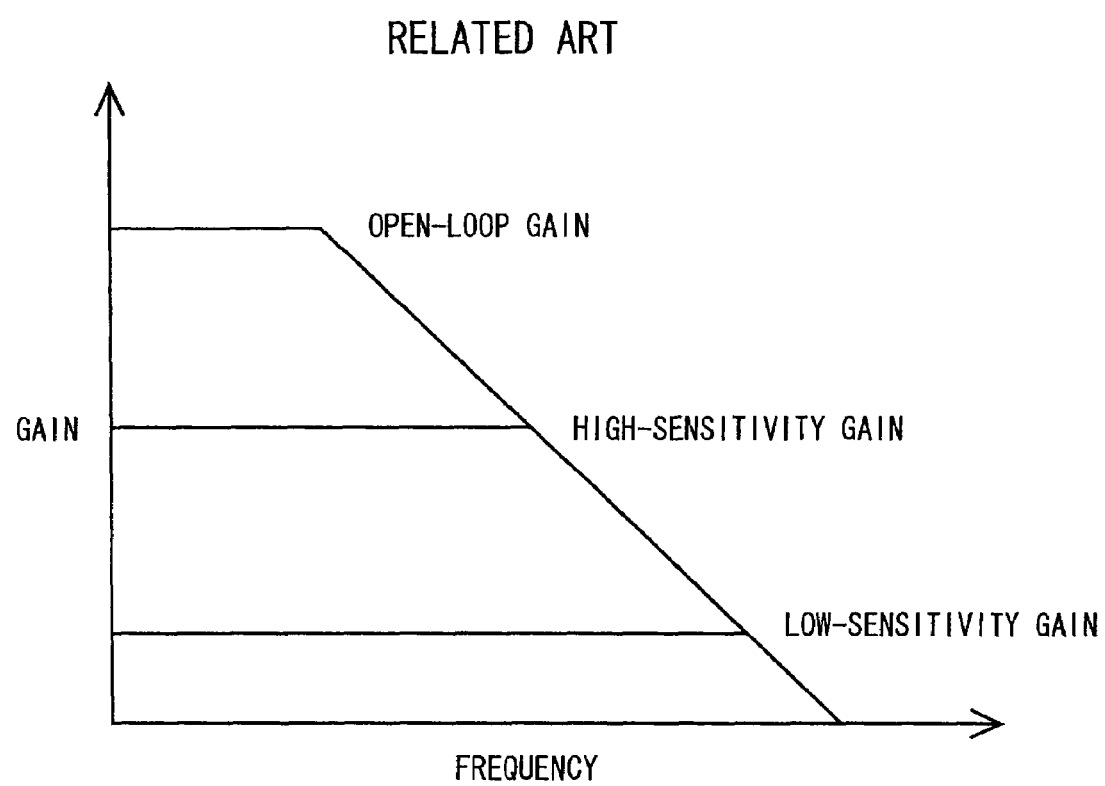
FIG. 8 is a graph of a relation between a frequency and gain of an amplifier of a conventional optical pickup circuit.

In the first and second embodiments, the different light receiving regions 301 and 302 or light receiving element groups 303 and 304 are radially-arranged but may be arranged in the other form without any particular limitations. For example, as shown in FIG. 7A, small-area light receiving regions 402 can be concentrically arranged around the center of large-area light receiving region 401. Alternatively, as shown in FIG. 7B, light receiving element groups 411 having more elements and light receiving element group 412 having fewer elements may be arranged in a stripe shape.

Incidentally, in the first embodiment, an area ratio among split regions of a single light receiving element is changed, and switches are connected to a single amplifier to selectively input a photocurrent, but plural light receiving regions in different area ratios may be connected to amplifiers. Incidentally, in the second embodiment, plural light receiving element groups are connected to amplifiers, but plural light receiving element groups may be connected to a single amplifier connected to a switch to selectively input a photocurrent.

It is apparent that the present invention is not limited to the above embodiment that may be modified and changed without departing from the scope and spirit of the invention.

What is claimed is:

1. A light-receiving semiconductor device for an optical disk device to drive an optical disk, said light-receiving semiconductor device comprising:
   a light-receiving unit including a plurality of light-receiving elements different in receiving sensitivity to detect an optical signal irradiated to the optical disk and to convert the detected optical signal into an electric signal to output the electric signal; and
   an amplifying unit including at least one amplifier to amplify the electric signal output from the light-receiving unit,
   wherein an amount of signal current input to the at least one amplifier is substantially constant when a level of light incident on the light-receiving unit varies.

2. The light-receiving semiconductor device according to claim 1, wherein the amplifying unit has one amplifier, and
   wherein the amplifier selectively inputs a signal of a predetermined intensity selected from electric signals output from the plurality of light-receiving elements.

3. The light-receiving semiconductor device according to claim 2, wherein the plurality of light-receiving elements differ from one another in light-receiving area.

4. The light-receiving semiconductor device according to claim 1, wherein the amplifying unit has as many amplifiers as the plurality of light-receiving elements,
   wherein output signals of the plurality of light-receiving elements are respectively input to each of the amplifiers, and
   wherein a predetermined signal is selected from the output signals to the amplifiers.

5. The light-receiving semiconductor device according to claim 4, wherein the plurality of light-receiving elements differ from one another in light-receiving area.

6. The light-receiving semiconductor device according to claim 5, wherein each of the plurality of light-receiving elements comprises one or more photodiodes.

7. The light-receiving semiconductor device according to claim 1, wherein the plurality of light-receiving elements differ from one another in light-receiving area.

8. The light-receiving semiconductor device according to claim 1, wherein each of the plurality of light-receiving elements comprises one or more photodiodes.

9. The light-receiving semiconductor device according to claim 1, wherein if a received light power differs between reading operations and writing operations, then photocurrents of the same amount are output by the light-receiving elements.

10. The light-receiving semiconductor device according to claim 1, wherein a surface of said light-receiving unit is split into the plurality of light-receiving elements at different area ratios,
    wherein the plurality of light-receiving elements output photocurrent in accordance with the area ratios to output a uniform amount of the photocurrent.

11. The light-receiving semiconductor device according to claim 10, wherein the split light-receiving elements are alternately arranged along a circumference of the light-receiving unit.

12. The light-receiving semiconductor device according to claim 1, wherein the light-receiving semiconductor further comprises a plurality of switches,
    wherein said plurality of switches are connected to the at least one amplifier,
    wherein each of said plurality of switches is connected to a split area of the plurality of light-receiving elements that have a same area, and
    wherein said switches are turned ON/OFF in accordance with a control signal.

13. The light-receiving semiconductor device according to claim 1, wherein said at least one amplifier receives the electric signal from the light-receiving elements with a same area rather than all of the plurality of light-receiving elements.

14. The light-receiving semiconductor device according to claim 1, wherein said amplifying unit comprises a plurality of amplifiers of same amplifying characteristics.

15. An optical pickup device, comprising:
    a light-emitting unit irradiating light to an optical disk; and
    a light-receiving semiconductor device comprising:
       a light-receiving element including a plurality of light-receiving regions different in area to detect an optical signal irradiated to the optical disk and to convert the detected optical signal into an electric signal to output the electric signal; and
       an amplifying unit including at least one amplifier to amplify the electric signal output from the light-receiving element,
    wherein an amount of signal current input to the at least one amplifier is substantially constant when a level of light incident on the light-receiving element varies, and
    wherein said amplifier receives the electric signal from the light-receiving regions with a same area rather than all of the plurality of light-receiving regions.

16. A light-receiving semiconductor device for an optical disk device, said light-receiving semiconductor device comprising:

a light-receiving unit including a plurality of light-receiving elements different in receiving sensitivity to detect an optical signal irradiated to the optical disk and to convert the detected optical signal into an electric signal to output the electric signal; and an amplifying unit including at least one amplifier to amplify the electric signal output from the light-receiving element, wherein the plurality of the light-receiving elements have light-receiving area sizes different from each other, and wherein each of the plurality of the light-receiving elements outputs a photocurrent in accordance with ratios of the light-receiving area sizes.

17. The light-receiving semiconductor device according to claim 16, wherein output of the light-receiving semiconductor device depends on a photocurrent of a selected one or more of the light-receiving elements in accordance with a level of light incident on the light-receiving unit, wherein an amount of signal current input to the at least one amplifier is substantially constant when a level of light incident on the light receiving unit varies.

18. The light-receiving semiconductor device according to claim 17, wherein the light-receiving semiconductor further comprises a plurality of switches, wherein said plurality of switches are connected to the at least one amplifier, wherein each of said plurality of switches is connected to a split area of the plurality of light-receiving elements that have a same area, and wherein said switches are turned ON/OFF in accordance with a control signal.

19. The light-receiving semiconductor device according to claim 16, wherein each of the plurality of light-receiving elements comprises one or more photodiodes.

20. The light-receiving semiconductor device according to claim 19, wherein the plurality of light-receiving elements is arranged in a concentric, radial, or stripe form.

* * * * *